United States Patent
Yang et al.

(10) Patent No.: US 12,101,985 B2
(45) Date of Patent: Sep. 24, 2024

(54) ARRANGEMENT OF ANODES IN DISPLAY MODULE, DISPLAY PANEL AND ELECTRONIC DEVICE

(71) Applicant: BEIJING XIAOMI MOBILE SOFTWARE CO., LTD., Beijing (CN)

(72) Inventors: Zongbao Yang, Beijing (CN); Yonghua Chen, Beijing (CN); Yan Zheng, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 346 days.

(21) Appl. No.: 17/165,866

(22) Filed: Feb. 2, 2021

(65) Prior Publication Data
US 2021/0399065 A1    Dec. 23, 2021

(30) Foreign Application Priority Data
Jun. 19, 2020 (CN) .......................... 202010567352.0

(51) Int. Cl.
*H10K 59/65*      (2023.01)
*H10K 59/121*    (2023.01)

(52) U.S. Cl.
CPC ........... *H10K 59/65* (2023.02); *H10K 59/121* (2023.02)

(58) Field of Classification Search
CPC .... H10K 59/121; H10K 59/353; H10K 50/81; H10K 59/40–70; H10K 59/35; H10K 59/352; G09G 2300/0439–0465
See application file for complete search history.

(56) References Cited

U.S. PATENT DOCUMENTS

| | | | | |
|---|---|---|---|---|
| 2002/0063701 A1* | 5/2002 | Sano | ............... | G09G 3/2003 345/204 |
| 2007/0257269 A1* | 11/2007 | Cho | ............... | H01L 33/20 257/E33.068 |
| 2011/0260952 A1* | 10/2011 | Hwang | ............. | G02F 1/134336 345/55 |
| 2012/0092238 A1* | 4/2012 | Hwang | ................ | G09G 3/3225 345/55 |

(Continued)

FOREIGN PATENT DOCUMENTS

| CN | 108010947 A | | 5/2018 | |
|---|---|---|---|---|
| CN | 108666338 A | * | 10/2018 | ....... G02F 1/133514 |

(Continued)

OTHER PUBLICATIONS

European Patent Office, Extended European Search Report Issued in Application No. 21151370.0, Jun. 25, 2021, Germany, 9 pages.

(Continued)

*Primary Examiner* — Roberto W Flores
(74) *Attorney, Agent, or Firm* — Syncoda LLC; Feng Ma

(57) ABSTRACT

A display module includes: an image capturing area, and a plurality of pixel units disposed in the image capturing area, wherein each of the pixel units comprises one anode unit which includes at least three anodes; wherein anode units of the pixel units are periodically arranged with one anode group as a basic unit to form a plurality of anode groups, each of the anode groups comprises at least two of the anode units, and arrangements of anodes of at least two of the anode units in each of the anode groups are different.

9 Claims, 8 Drawing Sheets

(56) References Cited

U.S. PATENT DOCUMENTS

| | | | |
|---|---|---|---|
| 2012/0133682 A1* | 5/2012 | Kawano | G09G 3/3233 |
| | | | 345/690 |
| 2016/0240730 A1* | 8/2016 | Murayama | H01L 33/14 |
| 2017/0294155 A1* | 10/2017 | Kim | G09G 3/2074 |
| 2018/0308907 A1* | 10/2018 | Jin | H10K 59/352 |
| 2019/0181191 A1* | 6/2019 | Chen | H10K 59/121 |
| 2020/0066809 A1 | 2/2020 | Liu | |
| 2021/0091145 A1* | 3/2021 | Huangfu | H10K 59/352 |
| 2021/0376010 A1* | 12/2021 | Liu | H10K 59/353 |
| 2022/0302221 A1* | 9/2022 | Zhang | H10K 59/352 |
| 2022/0310712 A1 | 9/2022 | Zhao et al. | |
| 2022/0392963 A1* | 12/2022 | Chen | H10K 59/8792 |
| 2023/0320160 A1* | 10/2023 | Huangfu | H10K 59/353 |
| | | | 257/40 |

FOREIGN PATENT DOCUMENTS

| | | | |
|---|---|---|---|
| CN | 111010468 A | 4/2020 | |
| CN | 111029391 A | 4/2020 | |
| CN | 111046599 A | 4/2020 | |
| CN | 111276055 A | 6/2020 | |
| EP | 3229223 A1 | 10/2017 | |
| JP | 2007103032 A | 4/2007 | |

OTHER PUBLICATIONS

State Intellectual Property Office of the People's Republic of China, Office Action and Search Report Issued in Application No. 2020105673520, Jun. 20, 2023, 19 pages. (Submitted with Machine Translation).

CN second office action and search report in Application No. 202010567352.0, mailed on Dec. 20, 2023.

European office action in Application No. 21151370.0, mailed on Feb. 22, 2024.

\* cited by examiner

ARRANGEMENT OF ANODES IN DISPLAY MODULE, DISPLAY PANEL AND ELECTRONIC DEVICE

CROSS-REFERENCE TO RELATED APPLICATION

This application claims priority to Chinese Patent Application No. 202010567352.0 filed on Jun. 19, 2020, the disclosure of which is hereby incorporated by reference in its entirety.

BACKGROUND

In order to avoid a front camera occupying an edge area of a display module, the front camera is usually disposed underneath the display module, and the display module is usually provided with a polarization layer, RGB pixel units and metal circuits related to the RGB pixel units, and other components.

SUMMARY

Various embodiments of the present disclosure provide a display module, a display panel and an electronic device.

According to one aspect of the present disclosure, a display module is provided. The display module comprises: an image capturing area, and a plurality of pixel units disposed in the image capturing area, wherein each of the pixel units comprises one anode unit which includes at least three anodes; wherein, anode units of the pixel units are periodically arranged with one anode group as a basic unit to form a plurality of anode groups, each of the anode groups comprises at least two of the anode units, and arrangements of anodes of at least two of the anode units in each of the anode groups are different.

According to a second aspect of the present disclosure, a display panel is provided. The display panel includes a display module, the display module includes: an image capturing area, and a plurality of pixel units disposed in the image capturing area, wherein each of the pixel units comprises one anode unit which includes at least three anodes; wherein, anode units of the pixel units are periodically arranged with one anode group as a basic unit to form a plurality of anode groups, each of the anode groups comprises at least two of the anode units, and arrangements of anodes of at least two of the anode units in each of the anode groups are different.

According to a third aspect of the present disclosure, an electronic device is provided. The electronic device includes: a display panel including a display module, a display surface; and a front camera disposed on a side of the display panel away from the display surface, and the front camera is opposite to an image capturing area of the display module in the display panel; wherein the display module includes: an image capturing area, and a plurality of pixel units disposed in the image capturing area, wherein each of the pixel units comprises one anode unit which includes at least three anodes; wherein, anode units of the pixel units are periodically arranged with one anode group as a basic unit to form a plurality of anode groups, each of the anode groups comprises at least two of the anode units, and arrangements of anodes of at least two of the anode units in each of the anode groups are different.

DETAILED DESCRIPTION

Figure 1:
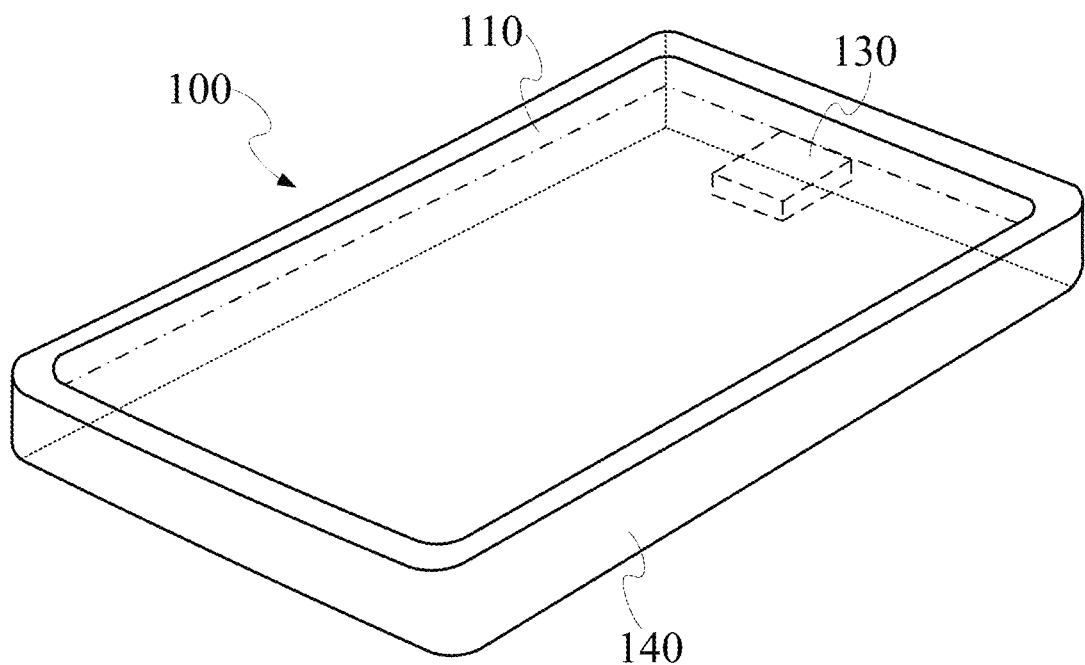
FIG. 1 is a schematic structural diagram of an electronic device according to some embodiments of the present disclosure.

Exemplary embodiments will be described in detail herein, examples of which are illustrated in the drawings. When the following descriptions involve the drawings, like numerals in different drawings represent like or similar elements unless stated otherwise. The implementations described in the following exemplary embodiments do not represent all implementations consistent with the present disclosure. Instead, they are merely examples of devices and methods consistent with some aspects of the present disclosure as detailed in the appended claims.

The terms used in the present disclosure are only for the purpose of describing specific embodiments and are not intended to limit the present disclosure. Unless defined otherwise, the technical terms or scientific terms used in the present disclosure should be in the general sense as understood by one having ordinary skill in the art to which the present disclosure pertains. The terms "first", "second" and the like used in the description and claims of the present disclosure do not represent any order, number or importance, but are merely used to distinguish different components. Likewise, similar words such as 'one' or 'an' also do not represent a number limitation, but rather represent that there is at least one. Unless indicated otherwise, like words such as 'comprise' or 'include' means that the elements or items in front of 'comprise' or 'include' now encompass the elements or items listed behind 'comprise' or 'include' and equivalents thereof, and do not preclude other elements or items. Similar words such as "connect" or "join" are not limited to physical or mechanical connection, but can include electrical connection, whether direct or indirect.

The singular forms "a", "said" and "the" in description and claims of the present disclosure are also intended to include plural forms unless the context clearly indicates otherwise. It should also be understood that the term "and/or" as used herein refers to and encompasses any or all possible combinations of one or more of the associated listed items.

Various components on a front surface of a display screen may block light and diffract light, and affect the propagation of the light to the front camera underneath the display screen, which is not desirable for the front camera to capture high quality images.

By reducing a shading ratio of an image capturing area of a display module, that is, reducing a shading area of the image capturing area to the front camera, more light can be transmitted to the front camera, thereby improving quality of an image captured by the front camera. However, reducing the shading ratio of the image capturing area of the display module may affect display effect of the display module, and even make the image capturing area and other display areas have a relatively significant color difference. In addition, improvement to quality of image captured by the front camera is limited.

Furthermore, when light passes through anodes of the display module, diffraction occurs to form stray light, which affects quality of image captured by the front camera. The display module provided by the embodiment of the present disclosure can effectively reduce diffraction and improve the quality of image captured by the front camera by improving arrangements of the anodes. The display module, display panel, and electronic device provided by the embodiments of the present disclosure will be described below with reference to the Figures.

The electronic device provided by the embodiments of the present disclosure includes, but is not limited to: a mobile phone, a tablet computer, an iPad, a digital broadcasting terminal, a messaging device, a game console, a medical device, exercise equipment, a personal digital assistant, a smart wearable device, a smart TV, a sweeping robot, a smart speaker, etc.

Figure 2:
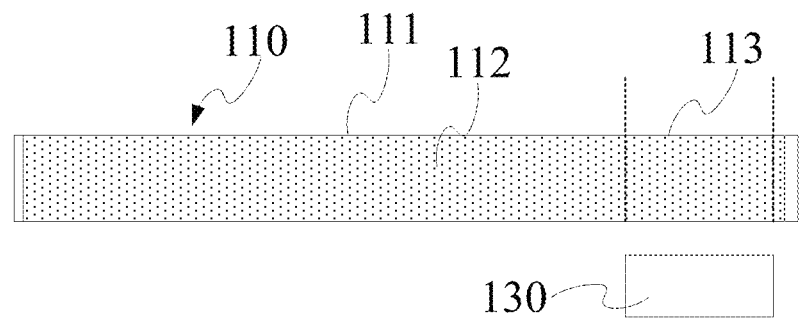
FIG. 2 is a schematic diagram illustrating a relative position of a display panel and a front camera according to some embodiments of the present disclosure.

FIG. 1 is a schematic structural diagram of an electronic device according to some embodiments of the disclosure. FIG. 2 is a schematic diagram illustrating a relative position of a display panel and a front camera according to some embodiments of the present disclosure. Referring to FIGS. 1 and 2, the electronic device 100 includes a display panel 110 and a front camera 130. The display panel 110 includes a display surface 111. The front camera 130 is disposed on/below a side of the display panel 110 away from the display surface 111. The display panel 110 includes a display module 112 having an image capturing area 113, and the front camera 130 is opposite to the image capturing area 113 of the display module 112 in the display panel 110. In this way, the front camera 130 can implement under-screen image capturing by receiving light passing through the image capturing area 113, while avoiding the front camera 130 from occupying the edge area of the display module 112, which is beneficial for the electronic device 100 to achieve full screen display effect. In some embodiments, in addition to the front camera, one or more sensing elements, such as an IR sensing element, may be provided below the image capturing area.

In some embodiments, the display panel 110 may be obtained by packaging the display module 112.

In some embodiments, the display panel 110 includes a first folding portion and a second folding portion, and the image capturing area 113 is provided in the first folding portion.

In some embodiments, the display panel 110 is an OLED (Organic Light-Emitting Diode) display panel.

In some embodiments, the display panel 110 is a flexible display panel. In another embodiment, the display panel 110 is a rigid display panel.

Referring to FIG. 1, the electronic device 100 further includes a body 140. The display panel 110 is assembled on the front of the body 140, and the front camera 130 is assembled on a side of the display panel 110 away from the display surface 111 and in a mounting cavity between the display panel 110 and the body 140. Other functional components can also be assembled within the body 140 to enable the electronic device 100 to have other functions.

Figure 3:
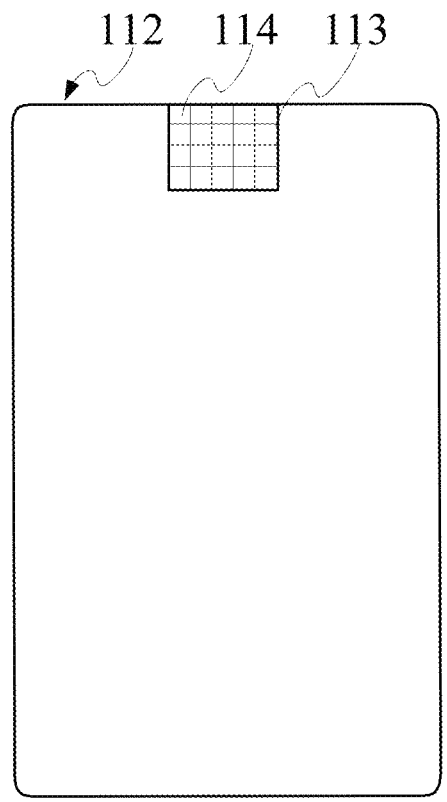
FIG. 3 is a schematic diagram of a partial structure of a display module according to some embodiments of the present disclosure.
Figure 4:
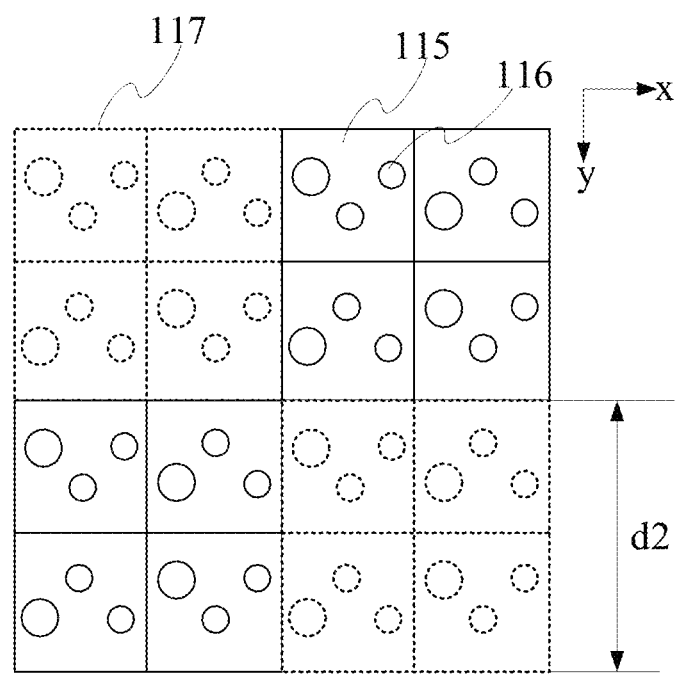
FIG. 4 is a schematic diagram of an arrangement of anodes according to some embodiments of the present disclosure.

FIG. 3 is a schematic diagram of a partial structure of a display module 112 according to some embodiments of the present disclosure. FIG. 4 is a schematic diagram of an arrangement of anodes 116 according to some embodiments of the present disclosure. Referring to FIGS. 3 and 4, the display module 112 has an image capturing area 113. The display module 112 includes a plurality of pixel units 114 disposed in the image capturing area 113, each pixel unit 114 includes one anode unit 115, and each anode unit 115 includes at least three anodes 116.

In some embodiments, each pixel unit 114 includes a R (red) sub-pixel unit, a G (green) sub-pixel unit, and a B (blue) sub-pixel unit. Each sub-pixel unit corresponds to one anode 116. Therefore, each anode unit 115 includes three anodes 116. In each anode unit 115, the structures of the three anodes 116 may be the same or different. In some embodiments, a shape of a cross-section of the anode 116 is selected from a regular shape such as circle (as shown in FIGS. 4-9, in the xy plane shown in FIG. 4), ellipse, triangle or square, or an irregular shape. In each anode unit 115, areas of the three anodes 116 may be the same or different, which is not specifically limited in the present disclosure. In some embodiments, for a circular anode, the center of anode is the center of the circle; for an elliptical anode, the center of anode is the center of the ellipse; for a triangle anode, the center of anode is the center of gravity, orthocenter, circumcenter or inner point of the triangle; for a square anode, the center of anode is the intersection of diagonal lines of the square; for an anode of an irregular shape or another regular shape, the center of anode is the center of gravity of the shape. A center of an anode unit is a center of a shape formed by connecting centers of the anodes included by the anode unit. For a triangle, the center of the anode unit is the center of gravity, orthocenter, circumcenter or inner point of the triangle; for a quadrilateral, the center of the anode unit is the intersection of diagonal lines of the quadrilateral; for an irregular shape or another regular shape, the center is the center of gravity of the shape.

A plurality of anode units 115 are periodically arranged with one anode group 117 as a basic unit to form a plurality of anode groups 117, and each anode group 117 includes at least two anode units 115. Arrangements of anodes 116 of at least two anode units 115 of the anode units in each anode group 117 are different.

It should be noted that, in the embodiments of the present disclosure, the term "arrangement of anodes" refers to the arrangement of the anodes 116 on the xy plane in FIG. 4. The term "area of anodes" refers to the area of the anodes 116 on the xy plane in FIG. 4.

Figure 5:
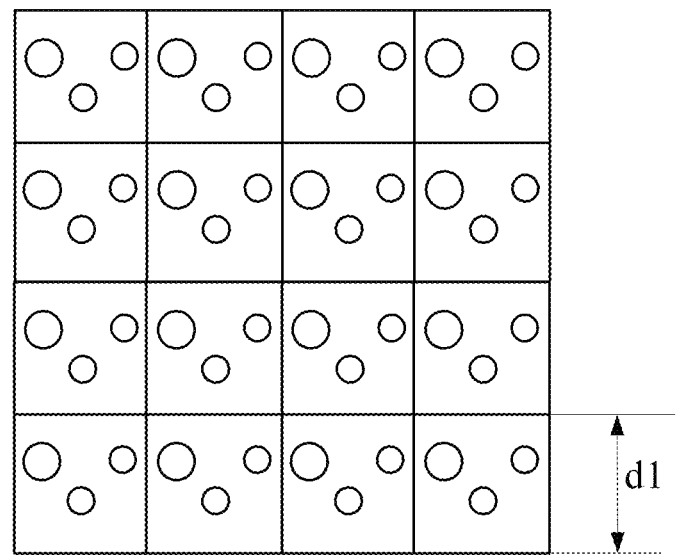
FIG. 5 is a schematic diagram of an arrangement of anodes in the related art.

FIG. 5 is a schematic diagram of an arrangement of anodes in the related art. In the related art, as shown in FIG. 5, each anode unit is a basic unit and a plurality of anode units are periodically arranged, that is, a plurality of anode units are arranged in an array with a length d1 of one anode unit as a cycle length. In some embodiments of the present disclosure, as shown in FIG. 4, area of anodes in each anode unit is not changed, and a plurality of anode groups 117 are arranged in an array with a length d2 of one anode group 117 as a cycle length. One anode group 117 includes at least two anode units 115, d2>d1. According to the application of Fourier transform in diffraction, a spatial domain function of the anode unit is formed into a frequency domain function after Fourier transform. If the cycle length of the anode unit 115 is larger, the spatial frequency in the frequency domain function is smaller, which reduces the distance between the diffracted rays and causes the diffracted rays to overlap, thereby reducing the interference of the diffracted stray light and making it hard for diffraction to occur, and further reducing the influence of the diffracted rays on the functioning of the front camera 130.

Since each anode group 117 includes at least two anode units 115, arrangements of anodes 116 of at least two anode units 115 of the anode units in each anode group 117 are different, and the anode units 115 are periodically arranged with one anode group 117 as a basic unit, thereby increasing the cycle length of the periodical arrangement, which enables the diffracted rays passing through the anodes 116 to become concentrated and can effectively reduce the interference of the diffracted rays on the front camera 130, thus ensuring quality of image captured by the front camera 130. Since the area and number of the anodes 116 in the anode unit 115 are not changed, the display effect of the display module 112 will not be affected.

In some embodiments, the anode group 117 includes a first anode unit, a second anode unit, . . . , an n-th anode unit, where n is an integer. An arrangement of anodes of an i-th anode unit is different from arrangement of anodes of at least one of the remaining n−1 anode units. For example, the arrangement of the anodes of the i-th anode unit is different from that of an m-th anode unit, and may be the same or different from the arrangements of the anodes of the remaining n−2 anode units, where i≠m, m and i are integers, and m<n.

Figure 6:
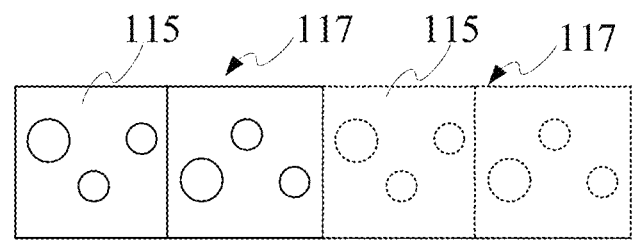
FIG. 6 is a schematic diagram of an arrangement of two anode groups according to some embodiments of the present disclosure.
Figure 7:
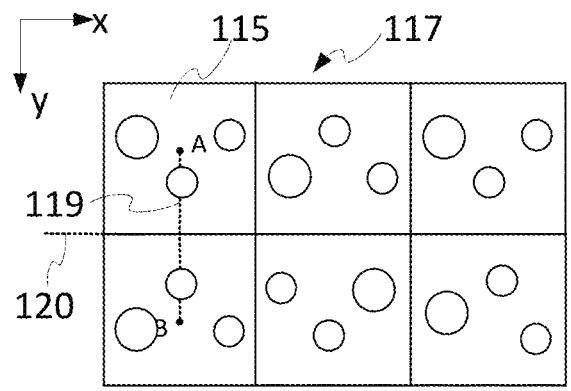
FIG. 7 is a schematic diagram of an arrangement of one anode group according to some embodiments of the present disclosure.

FIG. 6 is a schematic diagram of an arrangement of two anode groups 117 according to some embodiments of the present disclosure. FIG. 7 is a schematic diagram of an arrangement of one anode group 117 according to some embodiments of the present disclosure. In order to better distinguish the anode groups, part of the anode groups are shown in dashed lines.

In some embodiments, referring to FIG. 6, in the anode group 117, a plurality of anode units 115 are arranged in one row or one column. That is, n=2, 3, 4, 5, 6, 7, . . . , n, etc., and n anode units 115 included in each anode group 117 may be arranged in one row or one column.

For example, referring to FIG. 6, n=2, and each anode group 117 includes two anode units 115.

In other embodiments, n≥4, and in the anode group 117, n anode units 115 are arranged in a plurality of rows and columns.

For example, n is an odd or even number capable of forming an array, such as n=4, 6, 8, 9, 10, etc., and then n anode units 115 included in each anode group 117 may be arranged in a plurality of rows and columns.

For example, referring to FIG. 7, n=6, each anode group 117 includes six anode units 115, and the six anode units 115 are arranged in two rows and three columns.

In the embodiment of the present disclosure, when each anode unit 115 includes three anodes 116, the relative positions of the three anodes 116 in any anode unit 115 of each anode group 117 may be the same or different. For example, referring to FIG. 4, FIG. 6 or FIG. 7, each anode unit 115 includes three anodes 116, and connecting lines of centres of the three anodes 116 form a triangle. In this way, it is advantageous for the three anodes 116 to make full use of the area where the anode unit 115 is located. For the convenience of production, in the anode group 117, the relative position of the centres of the three anodes 116 in each anode unit 115 may be the same, and the arrangements of the three anodes can be adjusted in the following ways:

When the anode group 117 includes a first anode unit, a second anode unit, . . . , and an n-th anode unit, n being an integer, an arrangement of anodes 116 of an i-th anode unit is different from an arrangement of anodes 116 of an m-th anode unit, and i≠m, m<n, m and i are integers. In each anode group 117, the arrangement of the anodes 116 of the m-th anode unit can be obtained by rotating and/or flipping the arrangement of the anodes 116 of the i-th anode unit. In some embodiments, the arrangement of the anodes 116 of the m-th anode unit can be obtained by any i-th anode unit in any of the following ways.

In a first manner, the arrangement of the anodes 116 of the i-th anode unit is rotated by an angle around a vertical line perpendicular to the image capturing area 113 to obtain the arrangement of the anodes 116 of the m-th anode unit. The angle of the rotation may be 0°-360°. When the angle of the rotation is 0° or 360°, the arrangement of the anodes 116 of the i-th anode unit is the same as the arrangement of the anodes 116 of the m-th anode unit. However, in each anode group 117, there needs to be at least two anode units 115 with different arrangements of the anodes 116. For example, in FIG. 7, in the two anode units 115 located in the middle column, the arrangement of the anodes 116 of the lower anode unit 115 is the same as that of the above anode unit 115 after rotating 180° around the vertical line perpendicular to the image capturing area 113.

In a second manner, the arrangement of the anodes 116 of the i-th anode unit is changed axisymmetrically/flipped about a reference line to obtain the arrangement of the anodes 116 of the m-th anode unit. The reference line vertically bisects a connecting line of the centre of the i-th anode unit (for example, the point A or B shown in FIG. 7, which is barycentre of a triangle formed by connecting the centres of the three anodes) and the centre of the m-th anode unit. For example, in FIG. 7, the two anode units 115 located in the left column are axisymmetric about the reference line 120. The reference line 120 may be a vertical bisector of the connecting line 119 of the centres of the two anode units 115.

In a third manner, the arrangement of the anodes 116 of the i-th anode unit is rotated around a vertical line perpendicular to the image capturing area 113 and then is changed axisymmetrically/flipped about a reference line to obtain the arrangement of the anodes 116 of the m-th anode unit. The reference line is perpendicular to a connecting line of the centre of the i-th anode unit after rotation and the centre of the m-th anode unit. For example, in FIG. 7, for the two anode units 115 located in the right column, the arrangements of the anodes 116 of the two anode units 115 are axisymmetric about the reference line 120 after one of the anode units 115 rotates around a vertical line perpendicular to the image capturing area 113. The reference line 120 may be a vertical bisector of the connecting line of the centres of the two anode units 115. The vertical line perpendicular to the image capturing area 113 is also the vertical line of the xy plane.

The above three manners can relatively simply obtain two anode units with different arrangements of the anodes, which is convenient for production and beneficial to reducing diffraction interference, and does not affect the layout area and reflectivity of the anodes 116, thus ensuring the display effect of the display module 112. In some embodiments, the arrangements of the anodes in a portion outside the image capturing area of the display module may be different from that in the image capturing area. In another embodiment, the arrangements of the anodes in a portion outside the image capturing area of the display module may be the same as that in the image capturing area.

Figure 8:
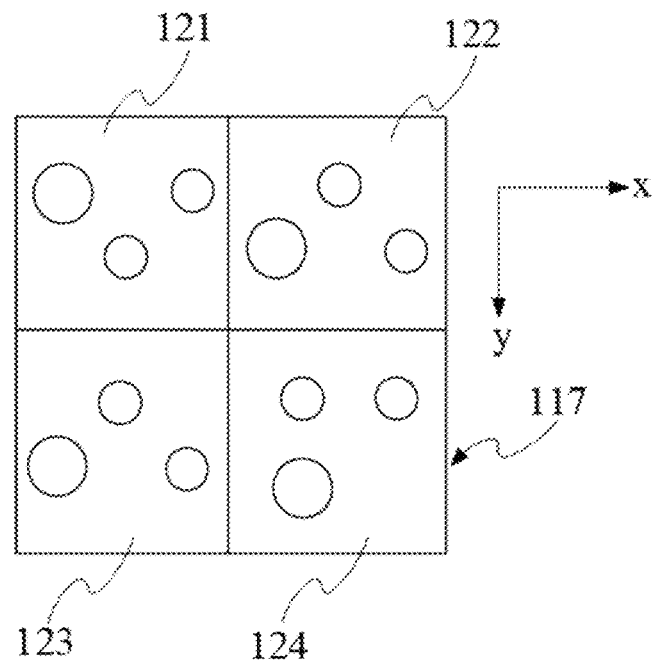
FIG. 8 is a schematic diagram of an arrangement of one anode group according to some embodiments of the present disclosure.
Figure 9:
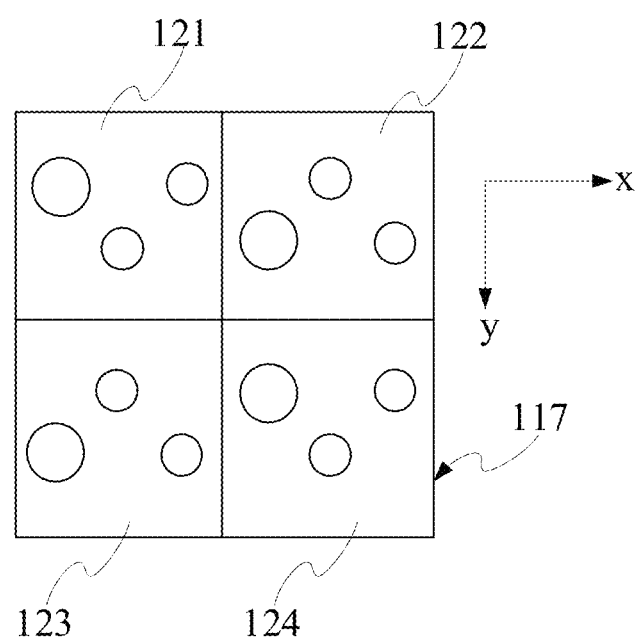
FIG. 9 is a schematic diagram of an arrangement of one anode group according to some embodiments of the present disclosure.

FIG. 8 is a schematic diagram of an arrangement of one anode group 117 according to some embodiments of the present disclosure. FIG. 9 is a schematic diagram of an arrangement of one anode group 117 according to some embodiments of the present disclosure. In some embodiments, referring to FIG. 8 or FIG. 9, n=4, the anode group 117 includes a first anode unit 121, a second anode unit 122, a third anode unit 123 and a fourth anode unit 124. The first anode unit 121 and the second anode unit 122 are disposed in one row, the third anode unit 123 and the fourth anode unit 124 are disposed in one row, the first anode unit 121 and the third anode unit 123 are disposed in one column, and the second anode unit 122 and the fourth anode unit 124 are disposed in one column. At least two of the first anode unit 121, the second anode unit 122, the third anode unit 123, and the fourth anode unit 124 have different arrangements of the anodes 116. Since the anode group 117 includes four anode units 115, the cycle length of the anode units 115 is longer, thereby reducing the interference of diffracted rays formed after passing through the anodes 116, and ensuring quality of image captured by the front camera 130.

In some embodiments, with continued reference to FIG. 8, the arrangement of the anodes 116 of the second anode unit 122 is the same as the arrangement of the anodes 116 of the third anode unit 123, and the arrangement of the anodes 116 of the first anode unit 121 is different from the arrangement of the anodes 116 of the fourth anode unit. In addition, the arrangement of the anodes 116 of the first anode unit 121 and the arrangement of the anodes 116 of the third anode unit 123 are axisymmetric about a reference line.

In other embodiments, with continued reference to FIG. 9, the arrangement of the anodes 116 of the first anode unit 121 is the same as the arrangement of the anodes 116 of the fourth anode unit 124, and the arrangement of the anodes 116 of the second anode unit 122 is the same as the arrangement of the anodes 116 of the third anode unit 123. The arrangement of the anodes 116 of the first anode unit 121 and the arrangement of the anodes 116 of the third anode unit 123 are axisymmetrical about a reference line, and the reference line vertically bisects the connecting line between the centre of the first anode unit and the centre of the third anode unit. In this way, the design difficulty is effectively reduced, and the interference of diffracted rays formed after passing through the anodes 116 is reduced, thereby ensuring the quality of image captured by the front camera 130 and the display effect of the display module 112.

Figure 10:
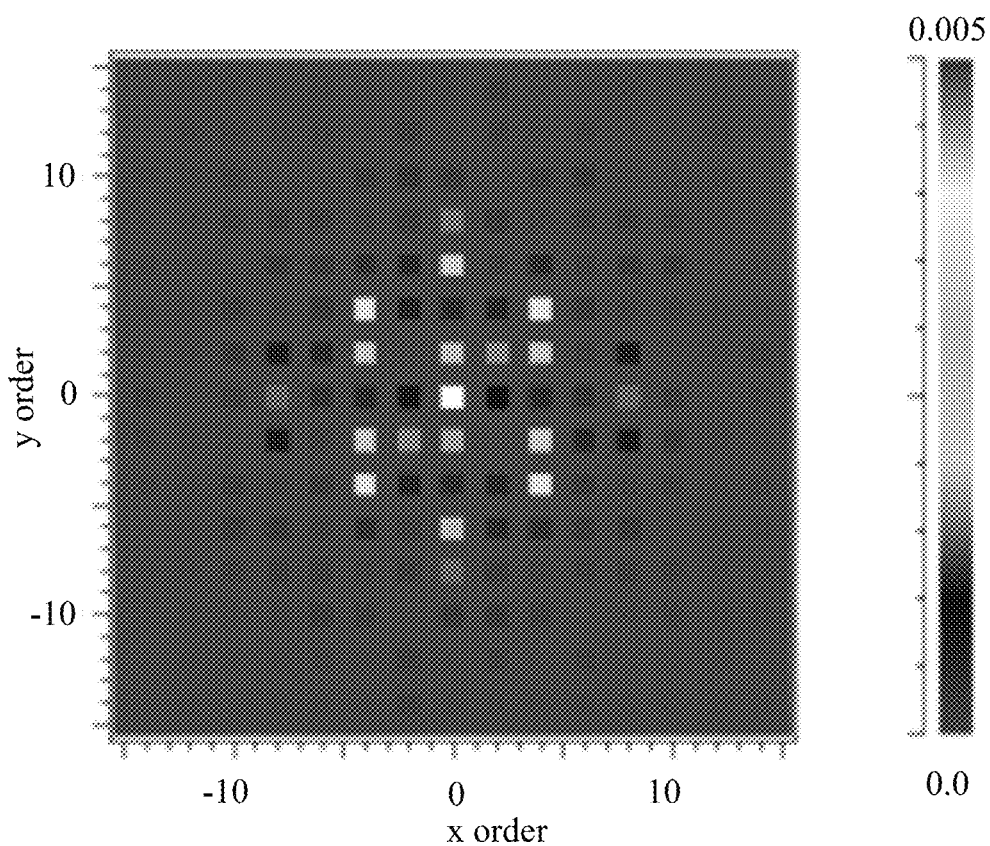
FIG. 10 is a diffraction intensity diagram of light passing through anodes in the related art.
Figure 11:
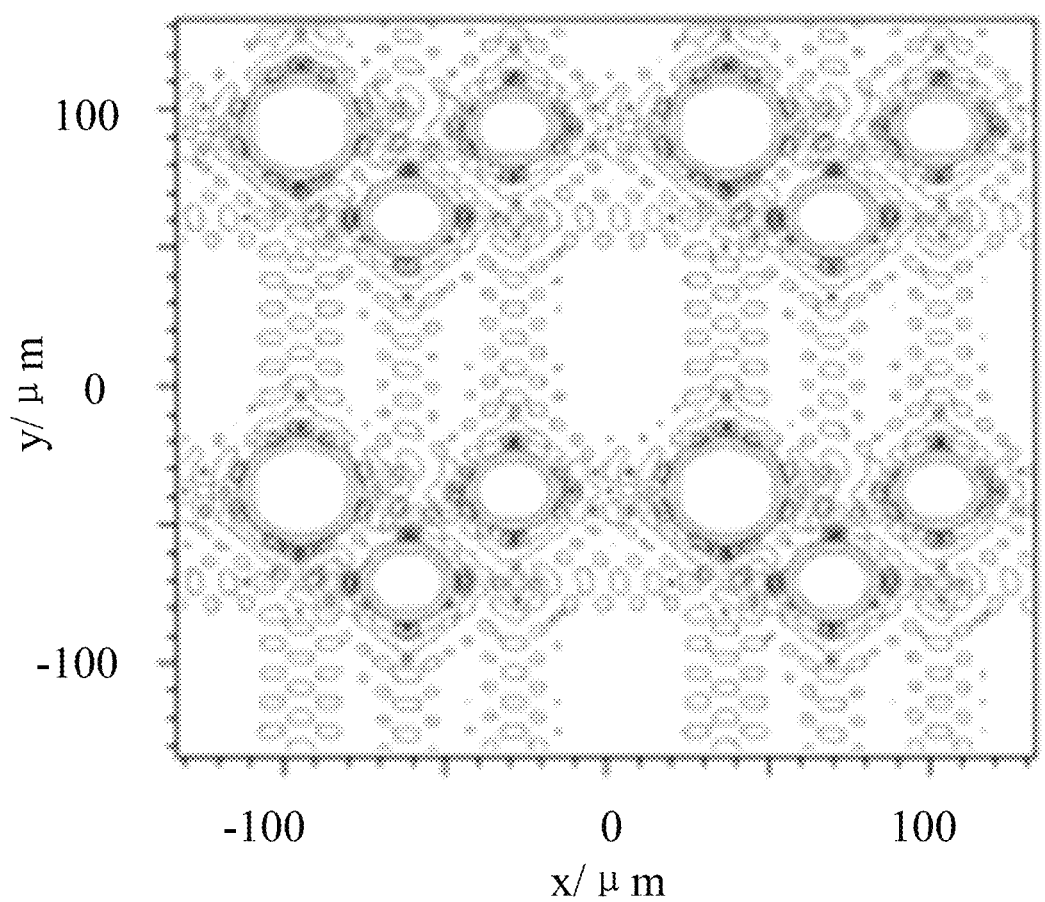
FIG. 11 is a diffraction pattern formed by light passing through anodes in the related art.
Figure 12:
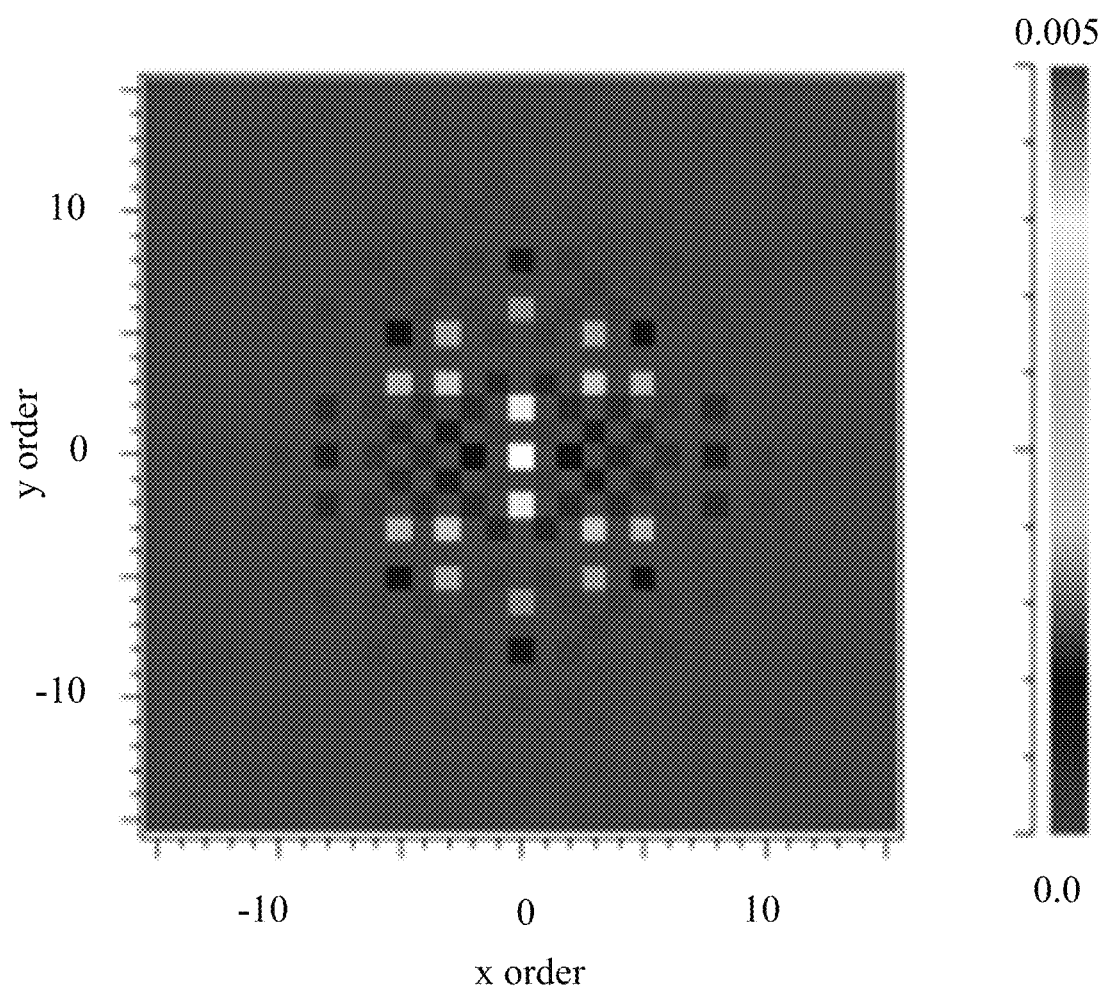
FIG. 12 is a diffraction intensity diagram of light passing through anodes according to some embodiments of the present disclosure.
Figure 13:
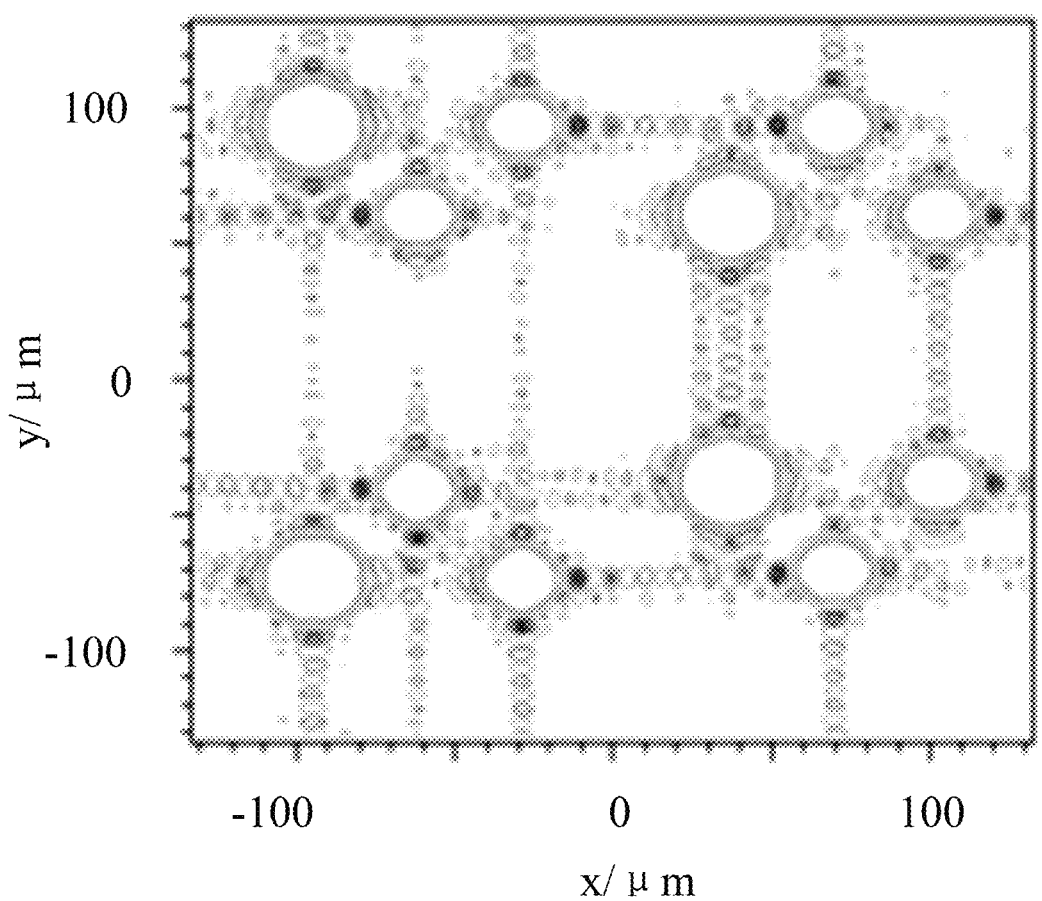
FIG. 13 is a diffraction pattern formed by light passing through anodes according to some embodiments of the present disclosure.

As shown in FIG. 9, the connecting lines of the centres of the three anodes 116 can form a triangle, and the following further describes in conjunction with FIGS. 10, 11, 12 and 13:

FIG. 10 is a diffraction intensity diagram formed by light passing through anodes 116 in the related art. FIG. 11 is a diffraction pattern formed by light passing through anodes 116 in the related art. FIG. 12 is a diffraction intensity diagram formed by light passing through anodes 116 according to some embodiments of the present disclosure. FIG. 13 is a diffraction pattern formed by light passing through anodes 116 according to some embodiments of the present disclosure. Table 1 is the diffraction efficiency corresponding to the diffraction intensity diagram in FIG. 10, and Table 2 is the diffraction efficiency corresponding to the diffraction intensity diagram in FIG. 12.

TABLE 1

|    | −2    | −1    | 0       | 1     | 2     |
|----|-------|-------|---------|-------|-------|
| −2 | 0.21% | 0.00% | 0.65%   | 0.00% | 0.00% |
| −1 | 0.00% | 0.00% | 0.00%   | 0.00% | 0.00% |
| 0  | 0.13% | 0.00% | 100.00% | 0.00% | 0.12% |
| 1  | 0.00% | 0.00% | 0.00%   | 0.00% | 0.00% |
| 2  | 0.00% | 0.00% | 0.66%   | 0.00% | 0.21% |

TABLE 2

|    | −2    | −1    | 0       | 1     | 2     |
|----|-------|-------|---------|-------|-------|
| −2 | 0.06% | 0.00% | 0.52%   | 0.00% | 0.05% |
| −1 | 0.00% | 0.02% | 0.00%   | 0.02% | 0.00% |
| 0  | 0.13% | 0.00% | 100.00% | 0.00% | 0.12% |
| 1  | 0.00% | 0.02% | 0.00%   | 0.02% | 0.00% |
| 2  | 0.06% | 0.00% | 0.52%   | 0.00% | 0.06% |

According to FIG. 10 and Table 1, when light passes through the anodes of the display module in the related art, the diffraction efficiency at the (−2, −2) order is 0.21%, and the diffraction efficiency at the (0, −2) order is 0.65%, and referring to FIG. 11, the diffraction patterns around the anodes are relatively diffuse. According to FIG. 12 and Table 2, when light passes through the anodes 116 of the display module 112 in the embodiments of the present disclosure, the diffraction efficiency at the (−2, −2) order is 0.06%, and the diffraction efficiency at the (0, −2) order is 0.52%, and referring to FIG. 13, the diffraction patterns around the anodes 116 is relatively few. Based on this, it can be seen that the display module 112 provided by the embodiments of the present disclosure can effectively reduce the diffraction interference caused by light passing through the anodes 116, thereby improving the quality of image captured by the front camera 130. In addition, since the area of the anodes 116 remains unchanged, the display effect of the display module 112 is ensured.

Figure 14:
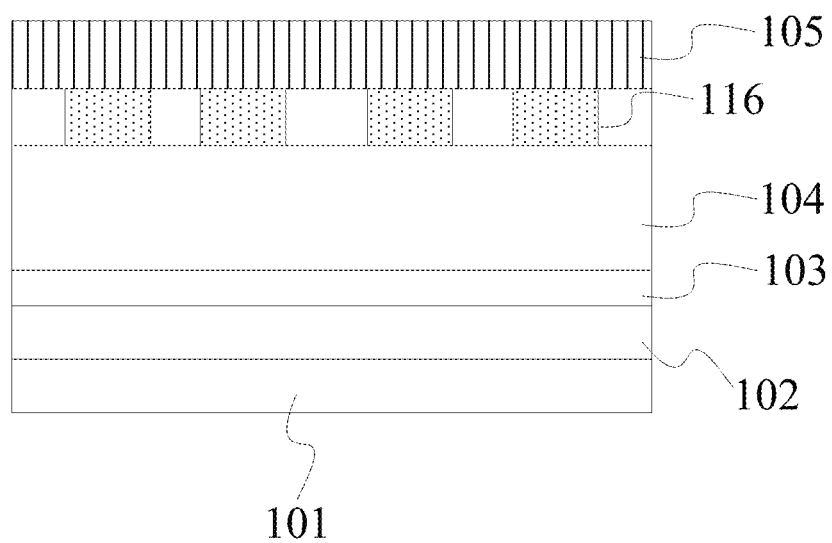
FIG. 14 is a partial cross-sectional view of a display module according to some embodiments of the present disclosure.

FIG. 14 is a partial cross-sectional view of a display module 112 according to some embodiments of the present disclosure. Referring to FIG. 14, the display module 112 further includes a glass substrate 101, a base layer 102 disposed on a side of the glass substrate 101, a cathode 103 disposed on a side of the base layer 102 away from the glass substrate 101, and a light-emitting layer 104 disposed on a side of the cathode 103 away from the base layer 102. The anodes 116 are disposed on the side of the light-emitting layer 104 away from the cathode 103, and a polarizing layer 105 is disposed on a side of the anodes 116 away from the light-emitting layer 104. Each pixel unit 114 includes the anode 116, the light-emitting layer 104, and the cathode 103. The cathode 103 and the anode 116 are disposed on both sides of the light-emitting layer 104, respectively. When a voltage is applied to the anode 116 and the cathode 103, the light-emitting layer 104 can emit light to give a display function to the display module 112.

In some embodiments, a refractive index of the anode 116 in the display area ranges from 1.53 to 1.94. Optionally, the refractive index of the anode 116 is 1.53, 1.63, 1.73, 1.83, or 1.94. In this way, the refractive index of the anode 116 is closer to the refractive index of other film layers, thereby reducing interference such as diffraction of light. Further, based on the arrangements of the anodes 116 of the anode units, interference such as diffraction of light and the like can be more effectively reduced, and the quality of image captured by the front camera 130 can be improved.

In some embodiments, a material of the anode 116 includes at least one of aluminium, silver, aluminium and indium tin oxide (Al+ITO), silver and indium tin oxide (Ag+ITO), aluminium and nickel (Al+Ni), and aluminium and platinum (Al+Pt). When the material of the anode 116 is composite materials, different materials of the composite materials can be constructed into different layers, respectively. The selection of the above-mentioned materials may enable the anodes 116 to have a good reflectivity, thereby ensuring the display effect of the display module 112 without increasing diffraction interference.

In summary, for the display module 112, the display panel 110, and the electronic device 100 provided by the embodiments of the present disclosure, each anode group 117 includes at least two anode units 115, and the anodes 116 of at least two anode units 115 of the anode units in each anode group 117 are arranged differently, and the anode units 115 are periodically arranged with one anode group 117 as a basic unit, thereby increasing the cycle length of the arrangement, which enables the diffracted rays passing through the anodes 116 to become concentrated and can effectively reduce the interference of the diffracted rays on the front camera 130, thus ensuring the quality of image captured by the front camera 130.

In some embodiments, as the area and number of the anodes 116 in the anode unit 115 are not reduced, the display effect of the display module 112 will not be affected. Furthermore, in some embodiments, in each anode group 117, the arrangement of the anodes 116 of the m-th anode unit can be obtained by rotating and/or flipping the arrangement of the anodes 116 of the i-th anode unit, which is convenient for production. In some embodiments, by setting the refractive index of the anode 116 in the range of 1.53 to 1.94, the refractive index of the anode 116 is closer to the refractive index of other film layers, which is more conducive to reducing the interference of the diffraction of light.

The display module, the display panel, and the electronic device provided by embodiments of the present disclosure can have one or more of the following advantages.

Each anode group includes at least two anode units, and in each anode group, the arrangements of the anodes of at least two anode units are different, and the anode units are periodically arranged with one anode group as a basic unit, thereby increasing the length of the periodically arrangement of the anode unit, which enables the diffracted rays passing through the anodes to become concentrated and can effectively reduce the interference of the diffracted rays on the front camera, thus ensuring quality of image captured by the front camera. Since the area and number of anodes in the anode unit are not changed, the display effect of the display module will not be affected.

The various device components, circuits, units, blocks, or portions may have modular configurations, or are composed of discrete components, but nonetheless can be referred to as "modules," "components," or "circuits" in general. In other words, the "components," "modules," "blocks," "circuits," "portions," or "units" referred to herein may or may not be in modular forms, and these phrases may be interchangeably used.

In the present disclosure, the terms "installed," "connected," "coupled," "fixed" and the like shall be understood broadly, and can be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the description of the present disclosure, the terms "one embodiment," "some embodiments," "example," "specific example," or "some examples," and the like can indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described can be combined in a suitable manner in any one or more embodiments or examples. In addition, various embodiments or examples described in the specification, as well as features of various embodiments or examples, can be combined and reorganized.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features can be described above as acting in certain combinations and even initially claimed as such, one or more features from a claimed combination can in some cases be excised from the combination, and the claimed combination can be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the implementations described above should not be understood as requiring such separation in all implementations, and it should be understood that the described program components and systems can generally be integrated together in a single software product or packaged into multiple software products.

As such, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing can be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

It should be understood that "a plurality" or "multiple" as referred to herein means two or more. "And/or," describing the association relationship of the associated objects, indicates that there may be three relationships, for example, A and/or B may indicate that there are three cases where A exists separately, A and B exist at the same time, and B exists separately. The character "/" generally indicates that the contextual objects are in an "or" relationship.

It may be further understood that terms "first", "second", etc. are used to describe various types of information, but the information should not be limited to these terms. These terms are only used to distinguish the same type of information from each other, and do not indicate a specific order or degree of importance. In fact, expressions such as "first" and "second" may be used interchangeably. For example, without departing from the scope of the present disclosure, first information may also be referred to as second information, and similarly, the second information may also be referred to as the first information.

In the present disclosure, it is to be understood that the terms "lower," "upper," "under" or "beneath" or "underneath," "above," "front," "back," "left," "right," "top," "bottom," "inner," "outer," "horizontal," "vertical," and other orientation or positional relationships are based on example orientations illustrated in the drawings, and are merely for the convenience of the description of some embodiments, rather than indicating or implying the device or component being constructed and operated in a particular orientation. Therefore, these terms are not to be construed as limiting the scope of the present disclosure.

In the present disclosure, a first element being "on" a second element may indicate direct contact between the first and second elements, without contact, or indirect geometrical relationship through one or more intermediate media or layers, unless otherwise explicitly stated and defined. Similarly, a first element being "under," "underneath" or "beneath" a second element may indicate direct contact between the first and second elements, without contact, or indirect geometrical relationship through one or more intermediate media or layers, unless otherwise explicitly stated and defined.

Some other embodiments of the present disclosure can be available to those skilled in the art upon consideration of the specification and practice of the various embodiments disclosed herein. The present application is intended to cover any variations, uses, or adaptations of the present disclosure following general principles of the present disclosure and include the common general knowledge or conventional technical means in the art without departing from the present disclosure. The specification and examples can be shown as illustrative only, and the true scope and spirit of the disclosure are indicated by the following claims.

What is claimed is:

1. A display module, comprising:
an image capturing area, and
a plurality of pixel units disposed in the image capturing area,
wherein each of the pixel units comprises one anode unit which comprises at least three anodes;
wherein, anode units of the pixel units are periodically arranged with one anode group as a basic unit to form a plurality of anode groups, each of the anode groups comprises at least two of the anode units, and arrangements of anodes of at least two of the anode units in each of the anode groups are different;
wherein each of the anode groups comprises a first anode unit, a second anode unit, . . . , and an n-th anode unit, and n is an integer;
wherein, an arrangement of anodes of the i-th anode unit is different from an arrangement of anodes of the m-th anode unit, and the arrangement of the anodes of the i-th anode unit is the same as or different from an arrangement of anodes of any one of remaining anode units, i≠m, m<n, m and i being integers;
wherein, in each of the anode groups, the arrangement of the anodes of the m-th anode unit is obtained by rotating the arrangement of the anodes of the i-th anode unit by an angle around a vertical line perpendicular to the image capturing area and/or flipping the arrangement of the anodes of the i-th anode unit about a reference line, the angle being greater than 0° and less than 360°, and the reference line perpendicularly bisecting a connecting line between a center of the i-th anode unit and a center of the m-th anode unit; and
wherein, in each of the anode groups, the anode units are arranged in a plurality of rows and columns, each of the anode groups at least comprises a first anode unit, a second anode unit, a third anode unit, and a fourth anode unit, the first anode unit and the second anode unit are disposed in one row, the third anode unit and the fourth anode unit are disposed in one row, the first anode unit and the third anode unit are disposed in one column, and the second anode unit and the fourth anode unit are disposed in one column, wherein the arrangement of anodes of the first anode unit is different from the arrangement of anodes of the fourth anode unit, the arrangement of anodes of the second anode unit is the same as the arrangement of anodes of the third anode unit, and the arrangement of the anodes of the first anode unit and the arrangement of the anodes of the third anode unit are axisymmetric about a reference line, the reference line vertically bisecting a connecting line between a center of the first anode unit and a center of the third anode unit.

2. The display module according to claim 1, wherein, in each of the anode groups,
the arrangement of the anodes of the i-th anode unit is the same as the arrangement of the anodes of the m-th anode unit after rotating by the angle around the vertical line perpendicular to the image capturing area; or,
the arrangement of the anodes of the i-th anode unit and the arrangement of the anodes of the m-th anode unit are axisymmetric about the reference line; or, the arrangement of the anodes of the i-th anode unit is axisymmetric about the reference line with the arrangement of the anodes of the m-th anode unit after rotating by the angle around the vertical line perpendicular to the image capturing area.

3. The display module according to claim 1, wherein each of the anode units comprises three anodes, and connecting lines of centers of the three anodes form a triangle.

4. The display module according to claim 1, wherein a refractive index of the anodes ranges from 1.53 to 1.94.

5. A display panel comprising:
a display module, comprises:
an image capturing area, and
a plurality of pixel units disposed in the image capturing area,
wherein each of the pixel units comprises one anode unit which comprises at least three anodes;
wherein, anode units of the pixel units are periodically arranged with one anode group as a basic unit to form a plurality of anode groups, each of the anode groups comprises at least two of the anode units, and arrangements of anodes of at least two of the anode units in each of the anode groups are different;
wherein each of the anode groups comprises a first anode unit, a second anode unit, . . . , and an n-th anode unit, and n is an integer;
wherein, an arrangement of anodes of the i-th anode unit is different from an arrangement of anodes of the m-th anode unit, and the arrangement of the anodes of the i-th anode unit is the same as or different from an arrangement of anodes of any one of remaining anode units, i≠m, m<n, m and i being integers;
wherein, in each of the anode groups, the arrangement of the anodes of the m-th anode unit is obtained by rotating the arrangement of the anodes of the i-th anode unit by an angle around a vertical line perpendicular to the image capturing area and/or flipping the arrangement of the anodes of the i-th anode unit about a reference line, the angle being greater than 0° and less than 360°, and the reference line perpendicularly bisecting a connecting line between a center of the i-th anode unit and a center of the m-th anode unit; and
wherein, in each of the anode groups, the anode units are arranged in a plurality of rows and columns, each of the anode groups at least comprises a first anode unit, a second anode unit, a third anode unit, and a fourth anode unit, the first anode unit and the second anode unit are disposed in one row, the third anode unit and the fourth anode unit are disposed in one row, the first anode unit and the third anode unit are disposed in one column, and the second anode unit and the fourth anode unit are disposed in one column, wherein the arrangement of anodes of the first anode unit is different from the arrangement of anodes of the fourth anode unit, the arrangement of anodes of the second anode unit is the same as the arrangement of anodes of the third anode unit, and the arrangement of the anodes of the first anode unit and the arrangement of the anodes of the third anode unit are axisymmetric about a reference line, the reference line vertically bisecting a connecting line between a center of the first anode unit and a center of the third anode unit.

6. The display panel according to claim 5, wherein, in each of the anode groups,
the arrangement of the anodes of the i-th anode unit is the same as the arrangement of the anodes of the m-th anode unit after rotating by the angle around the vertical line perpendicular to the image capturing area; or,
the arrangement of the anodes of the i-th anode unit and the arrangement of the anodes of the m-th anode unit are axisymmetric about the reference line; or,
the arrangement of the anodes of the i-th anode unit is axisymmetric about the reference line with the arrangement of the anodes of the m-th anode unit after rotating by the angle around the vertical line perpendicular to the image capturing area.

7. The display panel according to claim 5, wherein each of the anode units comprises three anodes, and connecting lines of centers of the three anodes form a triangle.

8. An electronic device, comprising:
a display module comprising:
an image capturing area, and
a plurality of pixel units disposed in the image capturing area,
wherein each of the pixel units comprises one anode unit which comprises at least three anodes;
wherein anode units of the pixel units are periodically arranged with one anode group as a basic unit to form a plurality of anode groups, each of the anode groups comprises at least two of the anode units, and arrangements of anodes of at least two of the anode units in each of the anode groups are different;
wherein each of the anode groups comprises a first anode unit, a second anode unit, . . . , and an n-th anode unit, and n is an integer;
wherein, an arrangement of anodes of the i-th anode unit is different from an arrangement of anodes of the m-th anode unit, and the arrangement of the anodes of the i-th anode unit is the same as or different from an arrangement of anodes of any one of remaining anode units, i≠m, m<n, m and i being integers;
wherein, in each of the anode groups, the arrangement of the anodes of the m-th anode unit is obtained by rotating the arrangement of the anodes of the i-th anode unit by an angle around a vertical line perpendicular to the image capturing area and/or flipping the arrangement of the anodes of the i-th anode unit about a reference line, the angle being greater than 0° and less than 360°, and the reference line perpendicularly bisecting a connecting line between a center of the i-th anode unit and a center of the m-th anode unit; and
wherein, in each of the anode groups, the anode units are arranged in a plurality of rows and columns, each of the anode groups at least comprises a first anode unit, a second anode unit, a third anode unit, and a fourth anode unit, the first anode unit and the second anode unit are disposed in one row, the third anode unit and the fourth anode unit are disposed in one row, the first anode unit and the third anode unit are disposed in one column, and the second anode unit and the fourth anode unit are disposed in one column, wherein the arrangement of anodes of the first anode unit is different from the arrangement of anodes of the fourth anode unit, the arrangement of anodes of the second anode unit is the same as the arrangement of anodes of the third anode unit, and the arrangement of the anodes of the first anode unit and the arrangement of the anodes of the third anode unit are axisymmetric about a reference line, the reference line vertically bisecting a connecting line between a center of the first anode unit and a center of the third anode unit;

a display surface; and a front camera disposed on a side of the display panel away from the display surface, and the front camera is opposite to an image capturing area of the display module in the display panel.

9. The electronic device according to claim 8, wherein the anode units are periodically arranged to form the plurality of anode groups to thereby increase a period length of the periodically arranged anode units, facilitate diffracted light passing through the anode units becoming concentrated and effectively reducing interference of the diffracted light on the front camera, and improving quality of images captured by the front camera, and wherein area and number of anodes in the anode units are unchanged such that display effect of the display module is not affected.

* * * * *